United States Patent [19]

Kling

[11] 4,323,155
[45] Apr. 6, 1982

[54] INTEGRATED CIRCUIT CARRIER

[76] Inventor: Jarrett B. Kling, 8 Oak La., Rochester, N.Y. 14610

[21] Appl. No.: 113,918

[22] Filed: Jan. 21, 1980

[51] Int. Cl.³ .................... B65D 73/02; B65D 85/42
[52] U.S. Cl. ................................................. 206/328
[58] Field of Search .............. 206/328, 591, 586, 523, 206/594

[56] References Cited

U.S. PATENT DOCUMENTS

| | | | |
|---|---|---|---|
| 2,727,738 | 12/1955 | Lindley | 206/594 X |
| 2,932,546 | 4/1960 | Marggraf et al. | 206/591 X |
| 2,937,745 | 5/1960 | Wilson | 206/591 X |
| 3,067,869 | 12/1962 | Denton | 206/523 |
| 3,935,357 | 1/1975 | Padovani | 206/594 |
| 3,980,221 | 9/1976 | Okada | 206/586 |

*Primary Examiner*—Herbert F. Ross
*Attorney, Agent, or Firm*—Martin Lukacher

[57] ABSTRACT

An integrated circuit carrier is provided by a housing having an opening which receives a rectilinear integrated circuit package such as a dual in line package. The opening is defined by interior walls of the housing and a plate which extends along one of the walls and has spring means interconnecting the plate and the one wall. The plate and the wall opposite thereto, which defines the opening, may be angularly disposed with respect to each other such that the opening is tapered. The resilient mounting tends to clamp on and hold the integrated circuit package within the confines of the housing which may be made of conductive plastic material which makes contact with the leads of the integrated circuit and shields and protects the integrated circuit both electrically and mechanically.

6 Claims, 3 Drawing Figures

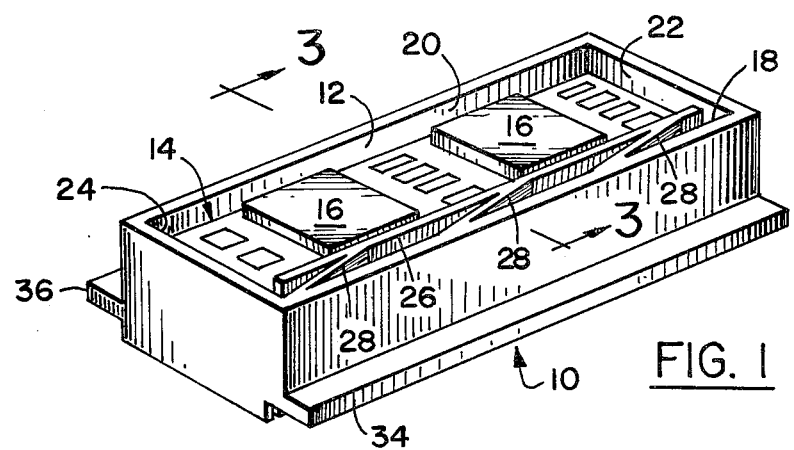
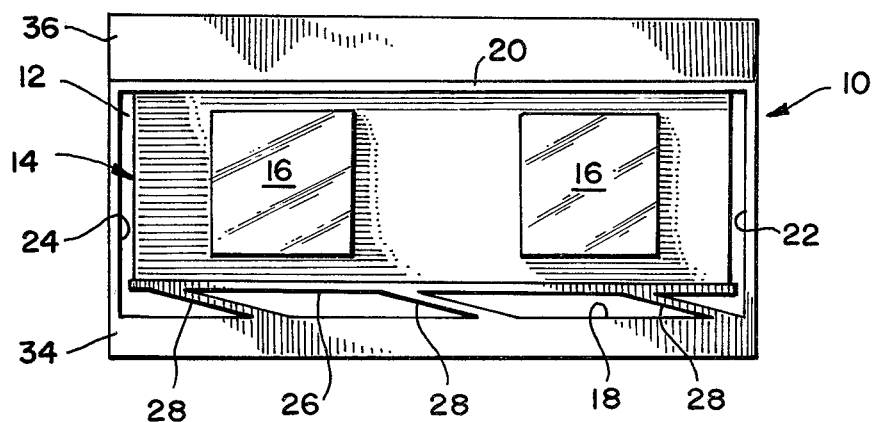
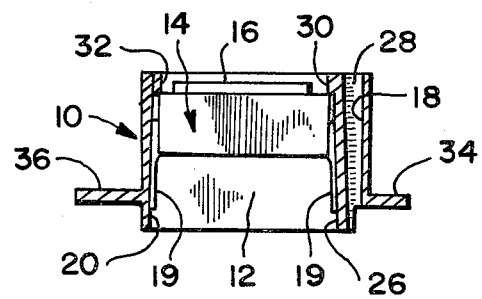

INTEGRATED CIRCUIT CARRIER

DESCRIPTION

The present invention relates to integrated circuit carriers and particularly to a simple and effective carrer for integrated circuits such as dual in line integrated circuit packages.

The invention is especially suitable for use as a carrier for integrated circuits which are affected by electrical fields. Such circuits include memory devices known as erasable programable read only memories (EPROM). By means of the carrier provided in accordance with the invention, such integrated circuits are both protected mechanically and against electrical interference which might damage the integrated circuit as by destroying the information signals stored therein.

Various integrated circuit carriers have been proposed. For example, in U.S. Pat. No. 3,480,902 issued Nov. 25, 1969, there is described a box-like carrier with grooves which retain the integrated circuit by means of a frictional fit between the leads of the integrated circuit and the walls of the carrier. Such carriers impart a strain to the leads and are adapted for use only with integrated circuit packages having dimensions closely matched to the dimensions of the carrier. Other integrated circuit carriers such as described in U.S. Pat. Nos. 3,409,861, issued Nov. 5, 1968, and 3,529,777, issued Sept. 15, 1970, involved the use of complex molded parts and are easily damaged in use. Other attempts at providing integrated circuit carriers have involved the use of multiple part carriers (see U.S. Pat. No. 3,823,350, issued July 9, 1974) or attachment techniques for leads of the circuits which make them adaptable only for special purpose use (see U.S. Pat. Nos. 3,516,044, issued June 2, 1970, and 3,781,613, issued Dec. 25, 1973).

A principal object of the present invention is to provide an improved integrated circuit carrier.

Another object of the present invention is to provide an improved integrated circuit carrier capable of retaining integrated circuits notwithstanding that the dimensions thereof vary from nominal dimensions by more than inconsiderable amounts.

A further object of the invention is to provide an improved integrated circuit carrier which electrically protects and shields the integrated circuits and protects and retains them and the information stored therein.

A still further object of the invention is to provide an improved integrated circuit carrier which can be handled readily on automatic machines which may be used to insert the integrated circuits therein.

A still further object of the invention is to provide an improved integrated circuit carrier which may be manufactured at very low cost.

A still further object of the invention is to provide an improved integrated circuit carrier adapted to carry integrated circuits in packages of various rectilinear shapes, such as dual in line packages, without risks of damaging the leads which extend from the package.

Briefly described a carrier for an integrated circuit package of rectilinear shape in accordance with the invention makes use of a housing having a generally rectilinear opening extending between opposite ends of the housing and into which the integrated circuit package may be inserted from one end of the opening. The housing has a pair of side walls which face each other and define the width of the opening. At least one plate in the opening adjacent to one of the side walls is resiliently mounted to that wall. The plate and the other of the side walls may be tapered toward each other to facilitate the insertion of the integrated circuit into the one end of the opening. The resilient mounting of the plate and the housing may be a unitary body made of conductive plastic material which both mechanically protect and electrically shield the integrated circuit retained therein. The integrated circuit is protected in the carrier by maintaining contact between the leads of the device and the walls of the carrier thereby equalizing the electrical potential of the leads. The resiliently mounted plate enables the retention of integrated circuits having dimensions which vary considerably from the nominal dimensions (viz., have large size tolerances.)

The foregoing and other objects and advantages of the invention as well as the presently preferred embodiment thereof will become more apparent from a reading of the following description in connection with the accompanying drawings in which:

FIG. 1 is a perspective view of an integrated circuit carrier for dual in line integrated circuit packages which is provided in accordance with the invention;

FIG. 2 is a top view of the carrier shown in FIG. 1;

FIG. 3 is a sectional view of the carrier shown in FIG. 1, the section being taken along the line 3—3 in FIG. 1.

Referring more particularly to the drawings, a rectilinearly shaped housing 10 has an opening 12 which receives and retains an integrated circuit 14. The illustrated integrated circuit is a dual in line integrated circuit package (DIP) which contains EPROM's 16. Other types of integrated circuit packages of a rectilinear shape may be disposed in the housing 10. Such packages have leads 19 which are in line with each other and are connected to the opposite side edges of the package.

The housing 10 encompasses the package 14. The housing and all of the parts thereof are preferably a unitary structure molded from conductive plastic. A suitable plastic is polypropylene having a large fractional part, say 20% by weight, of a conductive material, such as calcium carbonate in the resin which is used in fabricating the carrier. The integrated circuit package and the leads thereof are protected both mechanically and electrically by reason of the carrier and the shielding effect of the conductive plastic material of which it consists and as a direct result of equalization of the electrical potential by virtue of contact between the leads 19 and the housing (see FIG. 3). Information, as may be stored in the circuits 16, are also protected from external electrical fields by the carrier which thereby provides security against unwanted modifications of the stored information.

The opening 12 in the housing 10 is defined by opposing pairs of walls 18 and 20 which extend along the length of the opening. Other walls 22 and 24 extend along the width of the openings. The height of the wall 18 is somewhat less than the wall 20. The walls 22 and 24 are the same height as the wall 20. A plate 26 in the opening 12 is disposed adjacent to the wall 18 and is connected thereto by resilient means in the form of legs 28. These legs are parallel to each other and form acute angles with the wall 18 and the plate 26.

The height of the plate is substantially the same as the height of the wall 20 which opposes the plate 26. That wall 20 and the plate 26 narrow the width of the opening 12. The legs 28 are of the same height as the wall 18.

The plate 26, however, extends below the bottom of the wall 18.

The integrated circuit is inserted into the bottom of the opening 12 as viewed in the drawing. The wall 20 and the plate 26 are closer to each other near the top of the opening than they are near the bottom thereof. In other words, the opening is tapered inwardly. Although both the wall 20 and the plate 26 are shown inclined toward each other to form the tapered opening, either the wall 20 or the plate 26 alone may be inclined so as to provide the taper. It will also be appreciated that another plate similar to the plate 26 may be resiliently mounted on the wall 20 so that the opening is formed by a pair of spring-biased plates.

The spring legs 28 are integral with the plate 26 and the wall 18. All of the carrier is a unitary structure which may be molded in one piece. The edges of these legs are all parallel to each other to form parallelograms which allow the plate 26 to move laterally toward and away from the wall 18. Such movement accommodates tolerances in the dimensions of the package 14 from nominal dimensions. The dimensions of integrated circuit packages from different manufacturers vary in size. The dimensions of integrated circuits from the same manufacturer may vary and even among production lots. The carrier provided by the invention is therefore capable of handling and retaining the integrated circuits nothwithstanding large variations in their dimensions. The spring biased plates 26 also clamps and grips the integrated circuit without interference with the leads 19 thereof and assures that electrical contact between the leads 19 and the conductive housing 10 is made. This prevents damage not only to the integrated circuit but also to the leads.

Steps 30 and 32 near the top of the opening 12 are parallel to each other and at least one of the steps engages an edge of the package 14 when the package is inserted into the housing. The height of the steps is such that the upper surface of the package, which in the case of the illustrated circuit is the top of the device 16, is below the top of the housing. This construction insures that the package 14 is retained and encompassed within the confines of the housing 10.

Flanges 34 and 36 extend from the longitudinal sides of the housing 10. Automated machinery for handling the integrated circuit packages 14 and inserting them into the carrier may hold and guide the carriers by these flanges 34 and 36.

From the foregoing description, it will be apparent that there has been provided an improved integrated circuit carrier. The herein illustrated carrier protects both the electrical and mechanical integrity of the integrated circuits which are retained therein. Variations and modifications of the herein described integrated circuit carrier within the scope of the invention will undoubtedly suggest themselves to those skilled in the art. Accordingly, the foregoing description should be taken as illustrative and not in a limiting sense.

I claim:

1. A carrier for an integrated circuit package of rectilinear shape which comprises a housing having a generally rectilinear opening extending between opposite ends thereof for receiving said package when inserted into said opening from one of said ends thereof, said housing having first and second pairs of walls facing each other which defines said opening, at least one plate in said opening adjacent one of said first pair of walls and facing the other of said first pair of walls which narrows the distance across said opening between that first pair of walls, means providing a resilient mounting for said plate on said one of said first pair of walls which applies forces via said plate which tend to clamp and retain said package in said housing, at least said one plate and at least one of said first pair of walls being closer to each other at said one of said ends of said opening then at the other end of said opening to define a tapered receptacle for said package.

2. The invention as set forth in claim 1 wherein said one of said first pair of walls and said plate have steps therein which are parallel to each other and are disposed a predetermined distance from said other end of said opening, which distance is greater than the distance between the edge of said package and the surface thereof adjacent to said other end of said opening, when said package is located in said housing, such that said package is located entirely in said housing when said edge and step are in abutting relationship.

3. The invention as set forth in claim 1 wherein said housing, plate and resilient means are a unitary structure consisting of conductive plastic material.

4. The invention as set forth in claim 1 wherein said resilient means comprises a plurality of rectilinear legs parallel to each other and defining acute angles with said one of said first pair of walls and said plate, said legs each being integral with said plate and said one of the first pair of walls along opposite edges of said legs, said edges being parallel to said second pair of walls and being at least as long as said one of said first pair of walls.

5. A carrier for an integrated circuit package of rectilinear shape and having leads extending laterally outward and downward from opposite sides of said package, said carrier comprising a housing having a generally rectilinear opening extending between opposite ends thereof for receiving said package when inserted into said opening from one of said ends thereof, said housing having first and second pairs of walls facing each other which defines said opening, said first pair of walls being disposed along the side of said package from which the leads extend when said package is in said housing, and at least one of said first pair of walls being closer to the other of said first pair of walls at one of said ends of said opening than at the other end thereof to define a tapered receptacle for said package.

6. A carrier for an integrated circuit package of rectilinear shape and having leads extending laterally outward and downward from opposite sides of said package, said carrier comprising a housing having a generally rectilinear opening extending between opposite ends thereof for receiving said package when inserted into said opening from one of said ends thereof, said housing having first and second pairs of walls facing each other which defines said opening, said first pair of walls being disposed along the side of said packages from which the leads extend when said package is in said housing, at least one of the walls of one of said first pair and second pair of walls having a step disposed a predetermined distance between the ends of said opening, said step extending laterally across said opening a distance greater than the lateral extension of said leads from said package such that said step overlaps the top of said package, said predetermined distance as measured between the end of said opening opposite to said one end and said step being greater that the downward length of said leads, such that when said package is in said housing said top abuts said step and said package is entirely in said housing.

* * * * *